(12) United States Patent
Yanagimachi

(10) Patent No.: US 6,333,456 B1
(45) Date of Patent: *Dec. 25, 2001

(54) SOLAR CELL DEVICE AND METHOD OF PRODUCING THE SAME

(75) Inventor: Shinzo Yanagimachi, Higashimatsuyama (JP)

(73) Assignee: Citizen Watch Co., Ltd., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/600,758
(22) PCT Filed: Jan. 22, 1999
(86) PCT No.: PCT/JP99/00256
  § 371 Date: Jul. 21, 2000
  § 102(e) Date: Jul. 21, 2000
(87) PCT Pub. No.: WO99/38216
  PCT Pub. Date: Jul. 29, 1999

(30) Foreign Application Priority Data

Jan. 22, 1998 (JP) .................................... 10-10071

(51) Int. Cl.$^7$ .......................... H01L 31/04; H01L 31/075; H01L 31/05
(52) U.S. Cl. .......................... 136/255; 136/258; 136/261; 136/256; 257/53; 257/458; 257/459; 257/466; 438/85; 438/98; 438/96; 438/57
(58) Field of Search ............................. 136/255, 258 AM, 136/261, 256; 257/53, 458, 459, 466; 438/85, 98, 96, 57

(56) References Cited

U.S. PATENT DOCUMENTS

| 4,162,505 | * | 7/1979 | Hanak | 136/255 |
| 4,732,621 | * | 3/1988 | Murata et al. | 136/256 |

FOREIGN PATENT DOCUMENTS

| 978883-A1 | * | 2/2000 | (EP) . |
| 55-121685 | | 9/1990 | (JP) . |
| 3-1577 | | 1/1991 | (JP) . |
| 6-122982 | | 5/1994 | (JP) . |
| 8-51225 | | 2/1996 | (JP) . |
| 9-61806 | | 3/1997 | (JP) . |
| WO-99/38216-A1 | * | 7/1999 | (WO) . |
| WO-99/39390-A1 | * | 8/1999 | (WO) . |

* cited by examiner

*Primary Examiner*—Alan Diamond
(74) *Attorney, Agent, or Firm*—Armstrong, Westerman, Hattori, McLeland & Naughton, LLP

(57) ABSTRACT

A solar cell device (2) is formed into a laminated structure by providing a transparent oxide electrode (12) on the surface of an insulating substrate (10) which is a transparent glass substrate, providing a surface treatment layer (14) by performing oxidative plasma treatment on the surface of the transparent oxide electrode (12), providing a silicon nitride film (16) on the surface treatment layer (14), and laminating a p-type semiconductor layer (18), a buffer layer (20), an intrinsic semiconductor layer (22), an n-type semiconductor layer (24), and a metal electrode (26) on the silicon nitride film (16) in that order. Thereby, the surface of the transparent oxide electrode (12) is chemically stabilized by the surface treatment layer (14), resulting in improved open circuit voltage.

3 Claims, 8 Drawing Sheets

SOLAR CELL DEVICE AND METHOD OF PRODUCING THE SAME

TECHNICAL FIELD

The present invention relates to a silicon solar cell device achieving high conversion efficiency by improving open circuit voltage of the silicon solar cell device and a fabricating method of the same.

BACKGROUND TECHNOLOGY

FIG. 10 is a sectional view showing the structure of a conventional solar cell device 102.

The solar cell device 102 has a structure in which a transparent oxide electrode 12 is formed on the surface of an insulating substrate 10 which is a transparent glass substrate, and a p-type semiconductor layer 18, a buffer layer 20, an intrinsic semiconductor layer 22, an n-type semiconductor layer 24, and a metal electrode 26 are laminated in that order on to the surface of the transparent oxide electrode 12 into a laminated structure.

The insulating substrate 10 transmits light incident from the surface on the side thereof (the lower side in the drawing), on which the transparent oxide electrode 12 is not formed, to the transparent oxide electrode 12.

The transparent oxide electrode 12 is formed to lead light (mainly sunlight) incident through the insulating substrate 10 to the intrinsic semiconductor layer 22 through the p-type semiconductor layer 18 and the buffer layer 20 and to keep ohmic contact with the p-type semiconductor layer 18.

The p-type semiconductor layer 18 is a layer composed of a p-type semiconductor, which is provided to lead carriers, produced in the intrinsic semiconductor layer 22 by the incident light, to the transparent oxide electrode 12. The buffer layer 20 functions as a buffer layer for preventing a forbidden band width of the intrinsic semiconductor layer 22 from narrowing due to the mixing of p-type impurities (boron) contained in the p-type semiconductor layer 18, into the intrinsic semiconductor layer 22. The intrinsic semiconductor layer 22 is a layer made of an intrinsic semiconductor for producing carriers by absorbing incident light. The n-type semiconductor layer 24 is a layer made of an n-type semiconductor provided to lead the carriers produced in the intrinsic semiconductor layer 22 to the metal electrode 26. The metal electrode 26 is connected with an interconnection for taking out electromotive force.

Next, the fabricating method of the aforesaid conventional solar cell device will be described using FIG. 11 through FIG. 15.

First, tin oxide film is formed on the insulating substrate 10 to form a transparent oxide electrode 12, and thereafter a photoresist 13 is applied on the entire surface of the tin oxide film. The photoresist 13 is exposed and developed with a predetermined mask to remain in a region which is to be the solar cell device 102.

Next, as shown in FIG. 11, the transparent oxide electrode 12 is etched by means of a reactive ion etching system with the above photoresist 13 as an etching mask and with hydrogen iodide (HI) and argon (Ar) used as the raw material gas. Removing the photoresist 13 makes a state where the transparent oxide electrode 12 is provided on the surface of the insulating substrate 10 as shown in FIG. 12.

Subsequently, the p-type semiconductor layer 18 is formed on the entire surface of the insulating substrate 10 so as to cover the transparent oxide electrode 12, as shown in FIG. 13, by the plasma CVD (chemical-vapor deposition) method. At this time, mono-silane ($SiH_4$) and diborane ($B_2H_6$) are used as the raw material gas. Methane gas ($CH_4$) is simultaneously introduced to form silicon carbide in the p-type semiconductor layer 18, thereby preventing the forbidden band width of the p-type semiconductor layer 18 from narrowing and the light conversion efficiency from lowering. Sequentially, the buffer layer 20 is formed over the entire surface of the p-type semiconductor layer 18. This is carried out by the plasma CVD method with mono-silane ($SiH_4$) and methane gas ($CH_4$). The intrinsic semiconductor layer 22 is next formed on the entire surface of the buffer layer 20. This is also carried out by the plasma CVD method with monosilane ($SiH_4$) as the raw material gas.

Moreover, as shown in FIG. 14, the n-type semiconductor layer 24 is formed on the entire surface of the intrinsic semiconductor layer 22. This is performed by the plasma CVD method with mono-silane ($SiH_4$) and phosphine ($PH_3$) as the raw material gas. Thereafter, a metal film 25 which becomes the metal electrode 26 is formed on the entire surface of the n-type semiconductor layer 24 by the sputtering method and a photoresist 15 is applied on the entire surface of the metal film 25.

The photoresist 15 is exposed and developed with a predetermined mask, as shown in FIG. 15, to remain only in a region which is to be the solar cell device 102. Then, the metal film 25 and the respective layers laminated thereunder are etched and removed by the reactive ion etching method using the photoresist 15 as an etching mask, and the photoresist 15 used for the etching mask is also removed.

Consequently, the solar cell device 102 can be fabricated as shown in FIG. 10, in which all layers from the p-type semiconductor layer 18, the buffer layer 20, the intrinsic semiconductor layer 22, the n-type semiconductor layer 24 to the metal electrode 26 are laminated in that order on the transparent oxide electrode 12.

Incidentally, although the solar cell device 102 in the prior art can be fabricated by the above fabricating method, the solar cell device 102 has a structure using tin oxide as the transparent oxide electrode 12, and thus it has the following disadvantages regarding the structure. More specifically, tin oxide is a chemically very active substance and has a characteristic of being easy to react with a semiconductor layer laminated on the transparent oxide electrode 12. Accordingly, interdiffusion of atoms tends to occur between the transparent oxide electrode 12 and the p-type semiconductor layer 18, and thus there arise disadvantages that transparency of the transparent oxide electrode 12 deteriorates, resulting in a decrease in transmittance and that deterioration in film quality of an amorphous semiconductor layer (especially, the intrinsic semiconductor layer 22) causes a decrease in open circuit voltage.

Generally, it is required to improve efficiency of converting light to electrical energy as much as possible in a solar cell. Since the conversion efficiency of energy is obtained by the ratio of energy which incident light possesses to the maximum output which is obtained by the product of open circuit voltage and short circuit current, a decrease in open circuit voltage causes a decrease in the maximum output of the solar cell, resulting in a decrease in conversion efficiency of energy. Accordingly, it is an extremely important subject to stabilize the surface of the transparent oxide electrode for the prevention of a decrease in open circuit voltage due to the deterioration of the film quality thereof to thereby improve the output characteristics of the solar cell.

An object of the present invention is to improve output characteristics of a solar cell device including enhancement of open circuit voltage by solving the disadvantages as described above in the solar cell device and the fabricating method of the same.

DISCLOSURE OF THE INVENTION

To achieve the above object, the present invention is characterized by a solar cell device in which a transparent oxide electrode is provided on an insulating substrate, a p-type semiconductor layer, an intrinsic semiconductor layer, and an n-type semiconductor layer are provided over the transparent oxide electrode in that order, and a metal electrode is provided on the n-type semiconductor layer, in which the transparent oxide electrode is provided by being patterned by dry etching and side faces thereof which are not provided with the p-type semiconductor layer are formed in a tapered shape gradually inclined outward from the top end thereof toward the insulating substrate; the transparent oxide electrode is provided; with a surface treatment layer formed by performing oxidative plasma treatment on the entire surface thereof including the side faces which are not provided with the p-type semiconductor layer; and the p-type semiconductor layer is provided with the surface treatment layer therebetween a silicon nitride film is provided between the surface treatment layer and the p-type semiconductor layer; and the side faces of the transparent oxide electrode which are not provided with the p-type semiconductor layer are formed to be capable of being connected with an interconnection code via the surface treatment layer;

In the solar cell device, the provision of the surface treatment layer chemically stabilizes the transparent oxide electrode, thereby improving open circuit voltage.

Moreover, since the solor cell device is formed so that a silicon nitride film is provided between the surface treatment layer and the p-type semiconductor layer, the transparent oxide electrode is further chemically stabilized.

Further, since side faces of the transparent oxide electrode which are not provided with the p-type semiconductor layer are formed in a tapered shape gradually inclined outward from the top end thereof toward the insulating substrate, a break in the interconnection and a short circuit of the metal electrode are prevented.

Furthermore, the present invention is also characterized by following steps in a fabricating method at a solar cell device in which the solar cell device is fabricated by providing a transparent oxide electrode on an insulating substrate, providing a p-type semiconductor layer, an intrinsic semiconductor layer, and an n-type semiconductor layer on the transparent oxide electrode in that order, and providing a metal electrode on the n-type semiconductor layer.

That is, the step of forming the transparent oxide electrode by patterning by dry etching so that side faces thereof which are not provided with the p-type semiconductor layer are formed in a tapered shape gradually inclined outward from the top end thereof toward the insulating substrate;

the step of forming a surface treatment layer by performing oxidative plasma treatment using raw material gas composed of oxygen and argon in which the oxygen is included more than the argon on the entire surface of the transparent oxide electrode including the side faces which are not provided with the p-type semiconductor layer;

the step of forming a silicon nitride film on the surface treatment layer;

the step of forming the p-type semiconductor layer, an intrinsic semiconductor layer, and an n-type semiconductor layer on the silicon nitride film in that order; and the step of forming a metal electrode on the n-type semiconductor layer.

BEST MODE FOR CARRYING OUT THE INVENTION

The best mode for embodying a solar cell device according to the present invention and a fabricating method of the same will be described in detail hereinafter, using the accompanying drawings.

Figure 1:
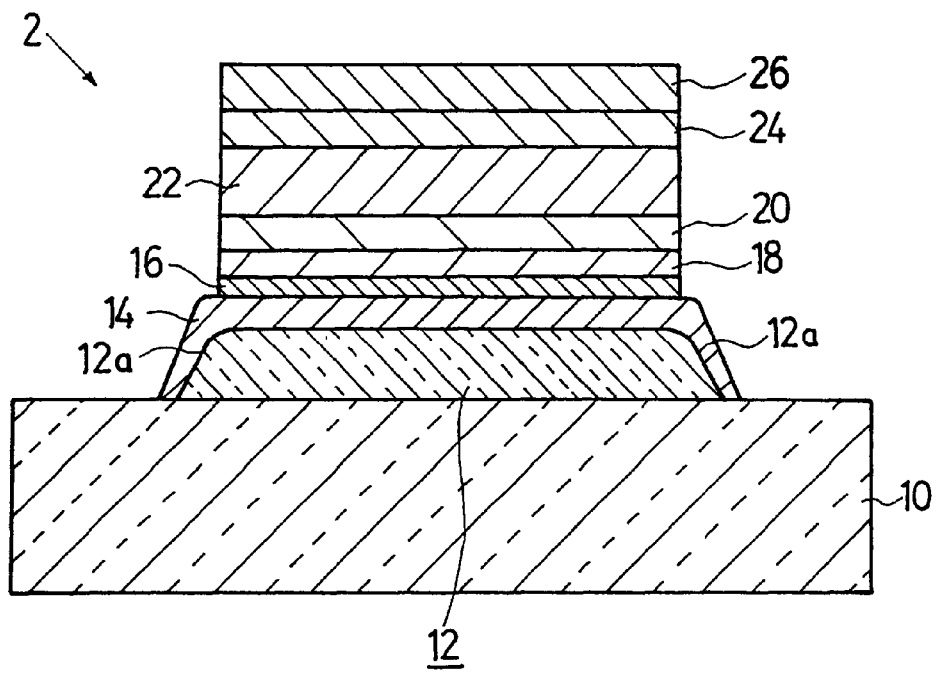
FIG. 1 is a sectional view showing the structure of a solar cell device in the best mode of the present invention.

Structure of the Solar Cell Device: FIG. 1

Figure 10:
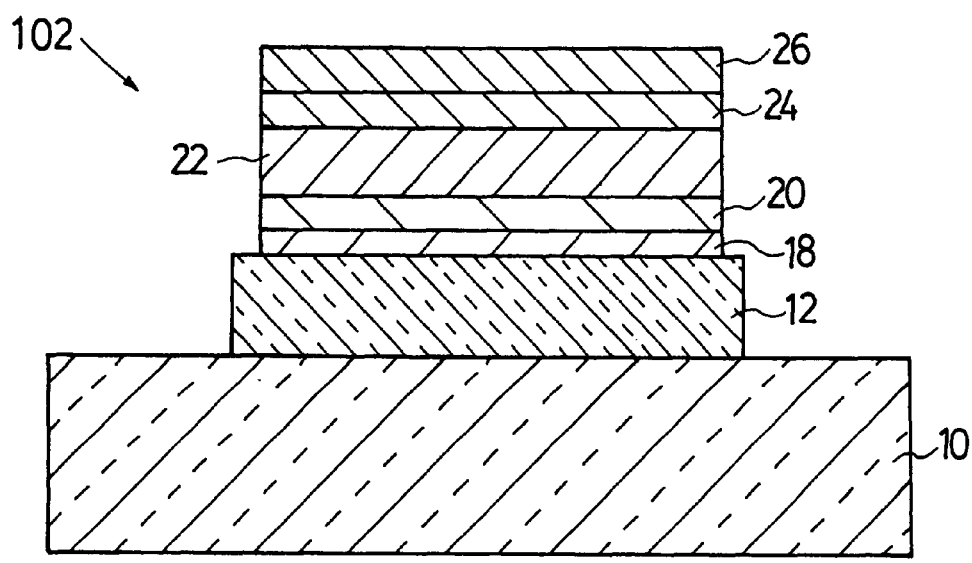
FIG. 10 is a sectional view showing the structure of a conventional solar cell device.
Figure 11:
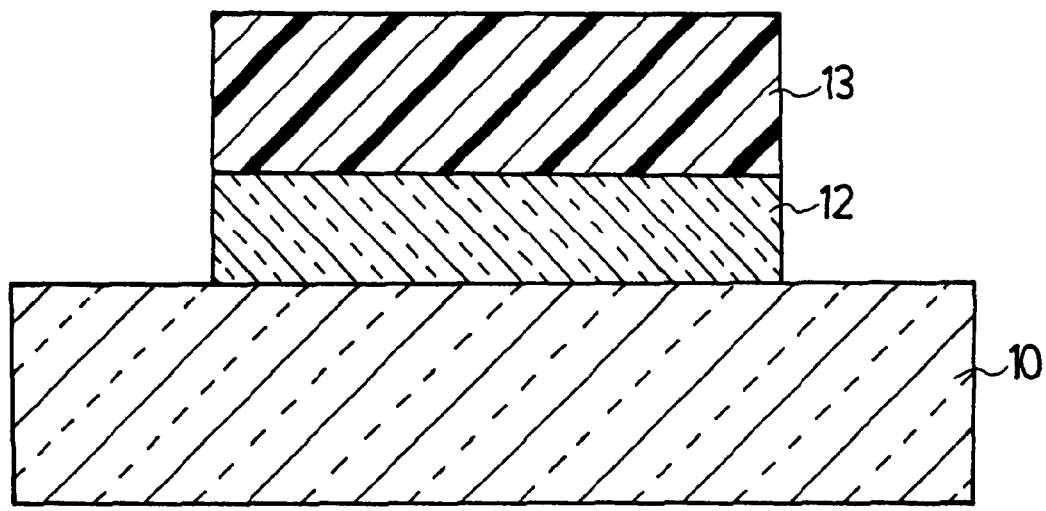
FIG. 11 to FIG. 15 are sectional views showing respective steps of a fabricating method of the conventional solar cell device.
Figure 12:
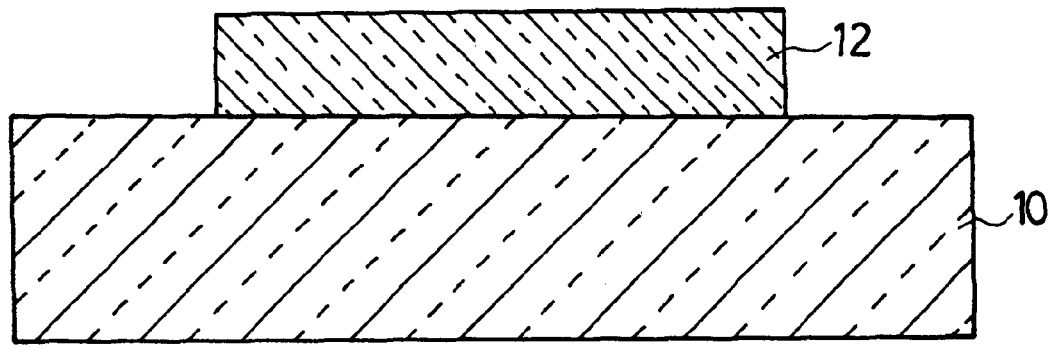
Figure 13:
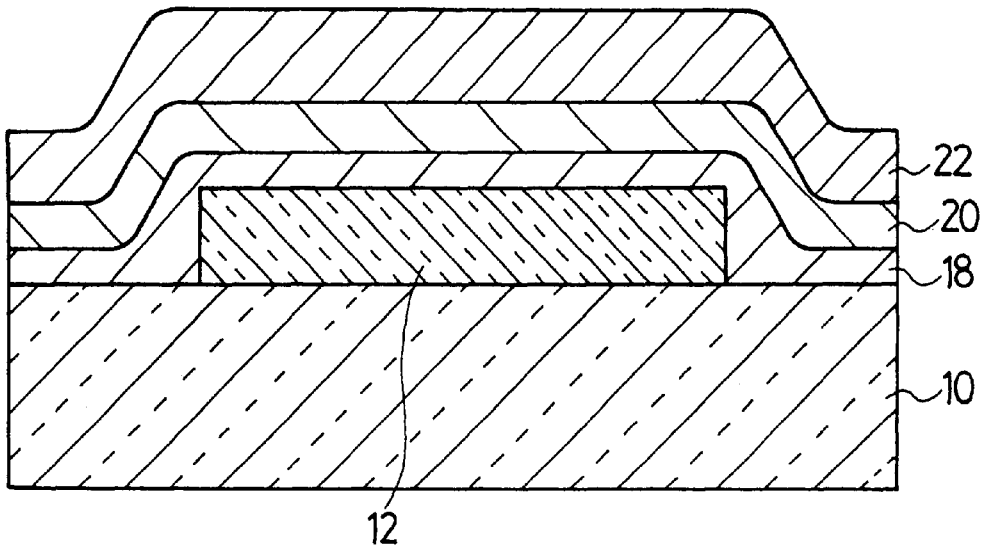
Figure 14:
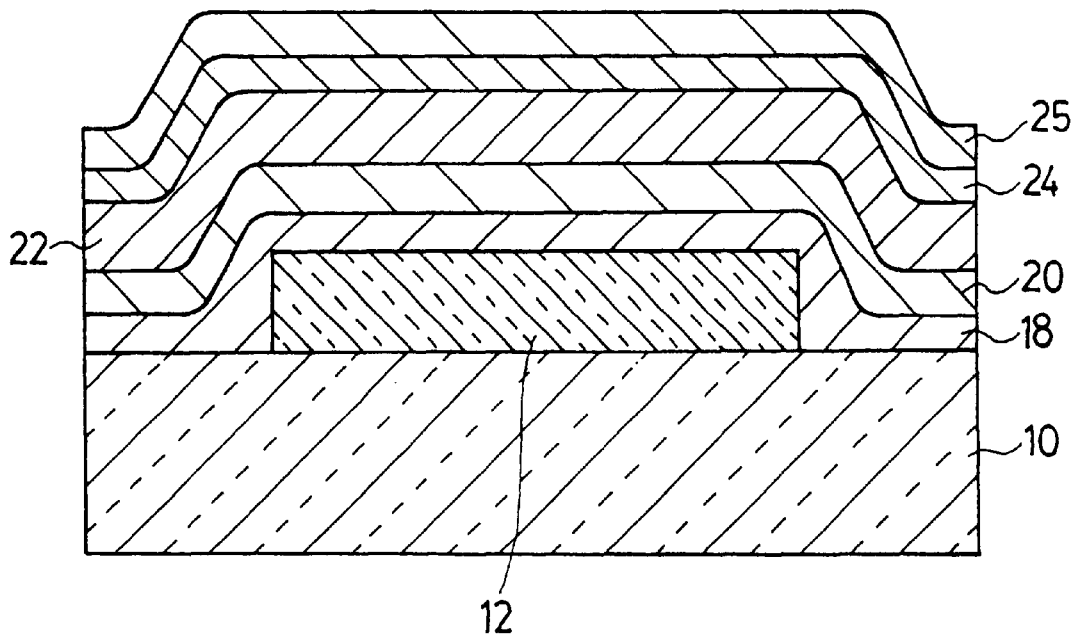
Figure 15:
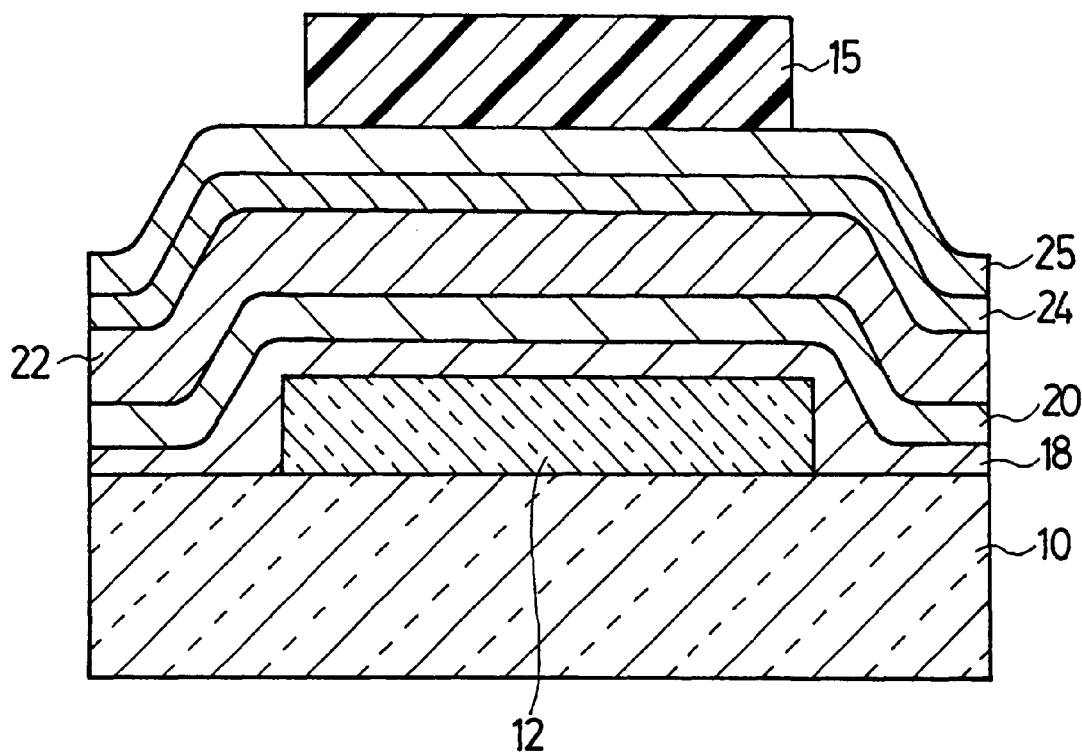

First, the structure of the solar cell device according to the present invention will be explained with reference to FIG. 1. It should be noted that the same structures as those in the conventional solar cell device shown in FIG. 10 are given the same numerals and symbols for explanation. FIG. 1 is a sectional view showing the structure of the solar cell device in the best mode according to the present invention.

As shown in FIG. 1, the solar cell device 2 has a structure in which a transparent oxide electrode 12 is provided on the surface of an insulating substrate 10 which is a transparent glass substrate, the surface of the transparent oxide electrode 12 undergoes oxidative plasma treatment to provide a surface treatment layer 14, on which a silicon nitride film 16 is provided, and a p-type semiconductor layer 18, a buffer layer 20, an intrinsic semiconductor layer 22, an n-type semiconductor layer 24, and a metal electrode 26 are laminated in that order on the surface of the silicon nitride film 16 into a laminated structure.

The insulating substrate 10 is shaped into a plate having a suitable size in width and depth and a suitable thickness and transmits light incident from the surface on the side thereof (the lower side in the drawing), on which the transparent oxide electrode 12 is not formed, to the transparent oxide electrode 12.

The transparent oxide electrode 12 is formed to lead light (mainly sunlight) incident through the insulating substrate 10 to the intrinsic semiconductor layer 22 through the surface treatment layer 14, the silicon nitride film 16, the p-type semiconductor layer 18, and the buffer layer 20, and to keep ohmic contact with the p-type semiconductor layer 18, and is connected with an interconnection for taking out generated electromotive force to the outside thereof.

As shown in FIG. 1, the transparent oxide electrode 12 according to the present invention is formed in a tapered shape in which side faces 12a which the p-type semiconductor layer 18 is not provided thereon, are gradually inclined outward from the top end thereof toward the insulating substrate 10. Thereby, a break in the interconnection and a short circuit of the metal electrode 26 is prevented.

On the surface of the transparent oxide electrode 12, the surface treatment layer 14 is formed by performing oxidative plasma treatment. The surface treatment layer 14 functions as a surface stabilizing layer for retarding the reduction of the transparent oxide electrode 12 and for chemically stabilizing the surface of the transparent oxide electrode 12 to improve characteristics of the solar cell device 2. More specifically, the oxidative plasma treatment allows oxygen atoms contained in the surface treatment layer 14 formed by the oxygen atom plasma to unite with not-yet-united tin atoms appearing on the surface of the transparent oxide electrode 12, thereby retarding the union of impurities (boron) contained in the p-type semiconductor layer 18 and the not-yet-united tin atoms (retardation of the reduction). Accordingly, the surface treatment layer 14 stabilizes the surface of the transparent oxide electrode 12.

The silicon nitride film 16 is formed to prevent mutual diffusion between the transparent oxide electrode 12 and the p-type semiconductor layer 18 and to prevent the reflection of incident sunlight in order to allow sunlight to efficiently stream into the intrinsic semiconductor layer 22.

The p-type semiconductor layer 18 is a layer composed of a p-type semiconductor which is provided to form an internal electric field for leading carriers produced in the intrinsic semiconductor layer 22 by incident light to the transparent oxide electrode 12.

The buffer layer 20 functions as a buffer layer for preventing a forbidden band width of the intrinsic semiconductor layer 22 from narrowing due to the mixing of the p-type impurities (boron) contained in the p-type semiconductor layer 18 into the intrinsic semiconductor layer 22 and for preventing light absorption efficiency from lowering. The intrinsic semiconductor layer 22 is a layer made of an intrinsic semiconductor for producing carriers (pairs of electron and hole) in correspondence with the absorbed energy of incident light. The n-type semiconductor layer 24 is a layer composed of an n-type semiconductor provided to form an internal electric field for leading the carriers produced in the intrinsic semiconductor layer 22 to the metal electrode 26. The metal electrode 26 is connected with an interconnection for taking out electromotive force.

Figure 2:
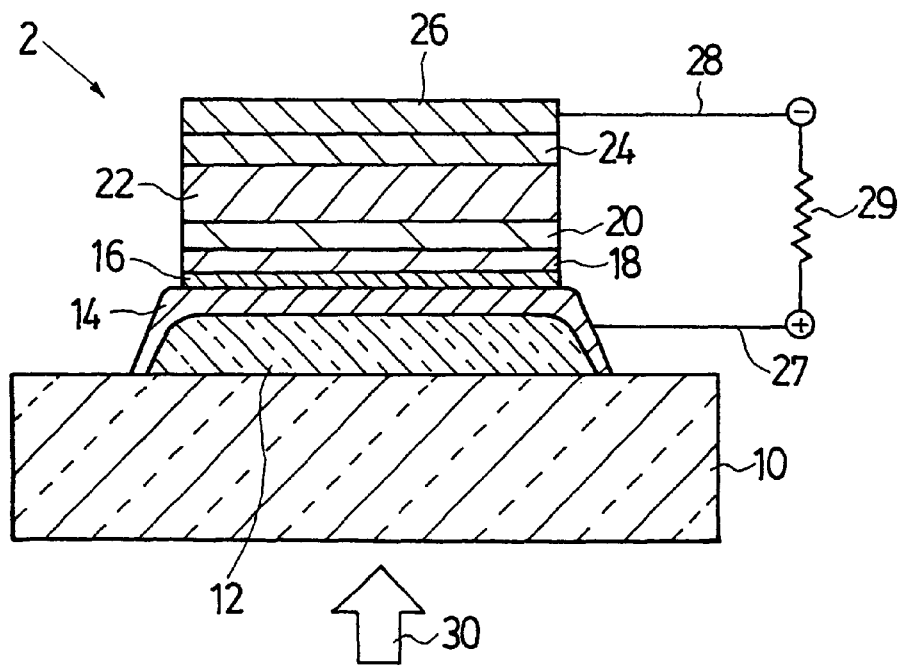
FIG. 2 is a sectional view showing a state of the solar cell device while in use.

The solar cell device 2 having such a structure is used as shown in FIG. 2. More specifically, an interconnection code 27 is connected with the surface of the transparent oxide electrode 12 via the surface treatment layer 14 and an interconnection code 28 is connected with the metal electrode 26, and a load resistance 29 is connected with the interconnection codes 27 and 28.

After light 30 streams in from the rear face, which is not provided with the transparent oxide electrode 12, of the insulating substrate 10, the incident light 30 reaches to the intrinsic semiconductor layer 22 from the transparent oxide electrode 12 through the surface treatment layer 14, the silicon nitride film 16, the p-type semiconductor layer 18 and the buffer layer 20. By receiving energy of the light 30, pairs of electrons and holes are produced in the intrinsic semiconductor layer 22. The pairs of electrons and holes are separated by an electric field formed by the p-type semiconductor layer 18 and the n-type semiconductor layer 24, whereby electromotive force appears in the transparent oxide electrode 12 and the metal electrode 26. The electromotive force can be taken out of the load resistance 29 connected with the solar cell device 2 via the interconnection codes 27 and 28. As a consequence, energy of incident light comes to be converted into electric energy.

In this case, since the transparent oxide electrode 12 is provided with the surface treatment layer 14 formed by oxidative plasma treatment on its surface, it is chemically stable by virtue of retardation of the reduction on the surface thereof. Accordingly, the transmittancy of the transparent oxide electrode 12 does not lower and the film quality of an amorphous semiconductor layer does not deteriorate, thus improving open circuit voltage to obtain preferable output characteristics as a solar cell device. Moreover, the provision of the silicon nitride film 16 can further stabilize the film quality of the transparent oxide electrode 12, thereby further improving open circuit voltage.

Fabricating Method for the Solar Cell Device: FIG. 3 to FIG. 9 and FIG. 1

Next, the fabricating method for the solar cell device according to an embodiment of the present invention will be described in detail, using FIG. 3 to FIG. 9 and FIG. 1.

Figure 3:
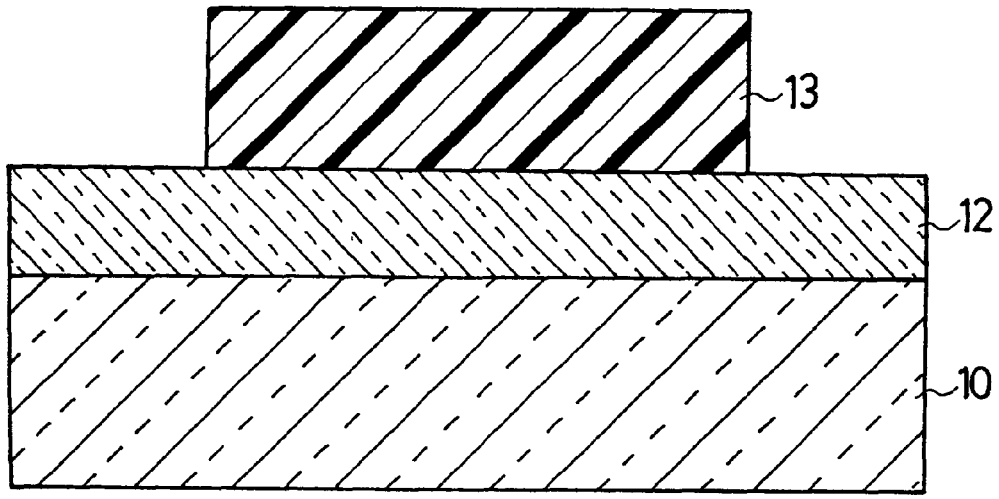
FIG. 3 to FIG. 9 are sectional views showing respective steps of a fabricating method of the solar cell device in the best mode of the present invention.

First, tin oxide film is formed to form the transparent oxide electrode 12 on the insulating substrate 10 as shown in FIG. 3. The above film is formed with a thickness approximately 900 nm by the CVD method. Then, the photoresist 13 with the film thickness of about 2.3 $\mu$m is applied over the entire surface of the insulating substrate 10 on which tin oxide film is formed, thereafter the photoresist 13 is exposed and developed with a predetermined mask so as to remain in a region which will become the solar cell device 2.

Figure 4:
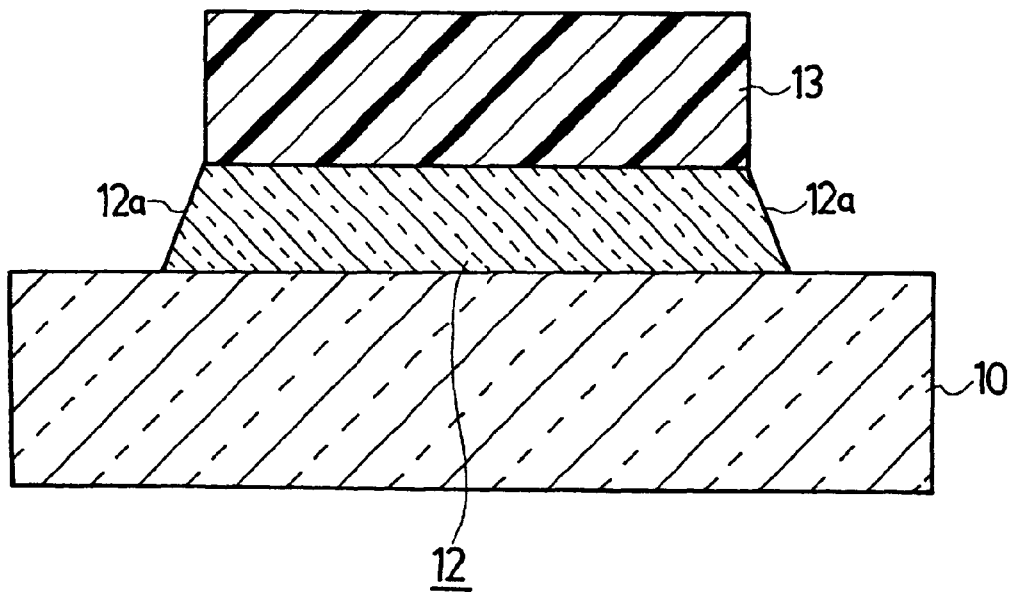
Figure 5:
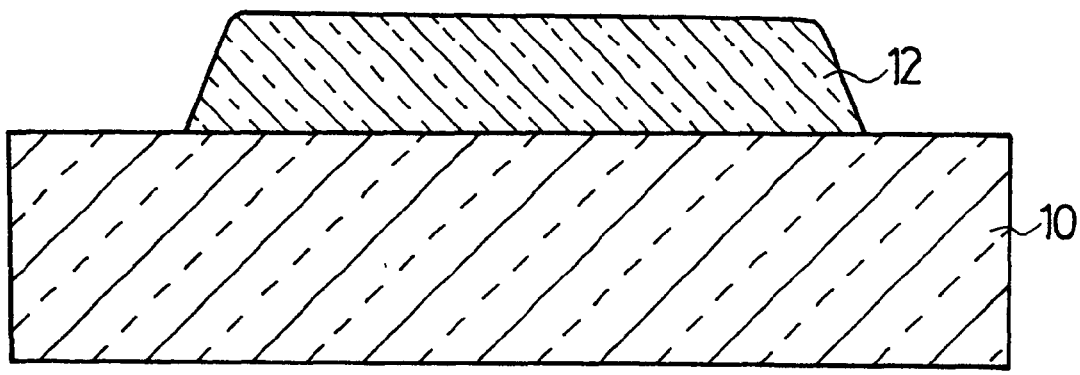

Subsequently, as shown in FIG. 4, the film-formed tin oxide is patterned by being etched by the reactive ion etching system using raw material gas composed of hydrogen iodide (HI) and argon (Ar) with the above photoresist 13 as an etching mask. The etching of the film-formed tin oxide is performed so that the side faces 12a which are not covered with the photoresist 13 are formed in a tapered shape gradually inclined outward from the top end thereof toward the insulating substrate 10 in order to prevent a break in the interconnection and a short circuit of the metal electrode 26. Removing the photoresist 13, a state where the transparent oxide electrode 12 is provided on the insulating substrate 10 is obtained as shown in FIG. 5.

Figure 6:
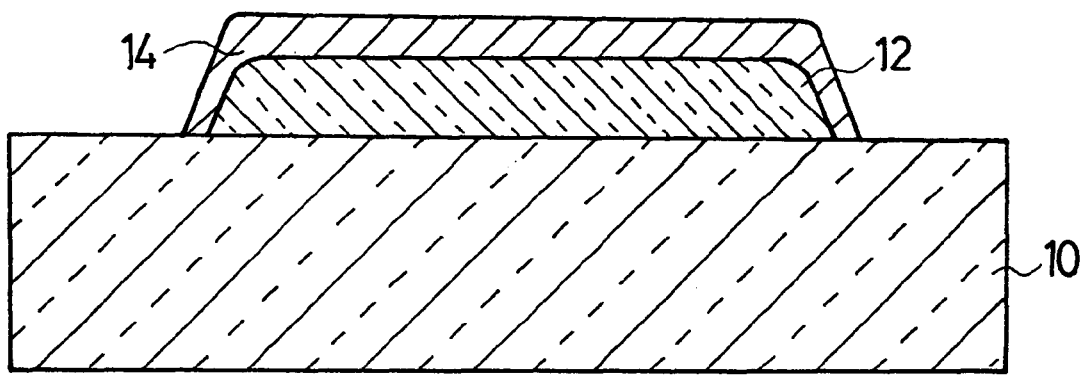

Next, in order to stabilize the surface of the transparent oxide electrode 12, oxidative plasma treatment is performed to form the surface treatment layer 14. The oxidative plasma treatment is carried out by exposing the transparent oxide electrode 12 to a plasma atmosphere applied with radio-frequency electric power of about 13.56 MHz at 300 W with raw material gas composed of oxygen ($O_2$) and argon (Ar) at a flow ratio of 6:1. As shown in FIG. 6, the surface treatment layer 14 having the film thickness of several nm performed the oxidative plasma treatment is formed not only on the transparent oxide electrode 12 but also on the side faces 12a.

Figure 7:
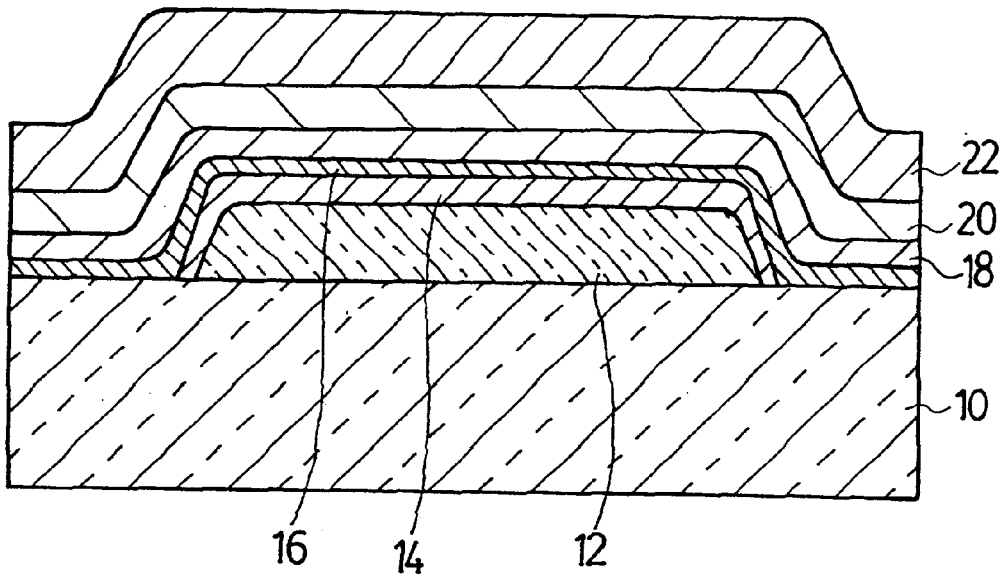

Moreover, as shown in FIG. 7, the silicon nitride film 16 for preventing reflection of incident sunlight is formed with a thickness of about 2 nm over the entire surface of the insulating substrate 10. This treatment is carried out by the plasma CVD (chemical-vapor deposition) method with radio-frequency discharge of about 13.56 MHz, using mono-silane ($SiH_4$) and nitrogen ($N_2$) as the raw material gas.

Thereafter, the p-type semiconductor layer 18 is formed over the entire surface of the insulating substrate 10 in such a manner to cover the silicon nitride film 16 by the plasma CVD (chemical-vapor deposition) method. At this time, mono-silane ($SiH_4$) and diborane ($B_2H_6$) are used as the raw material gas and the film thickness of the p-type semiconductor layer 18 is made about 10 nm. Simultaneously, methane gas ($CH_4$) is introduced to make silicon carbide in the p-type semiconductor layer 18, thereby preventing the forbidden band width of the p-type semiconductor layer 18 from narrowing and preventing the light converting efficiency from lowering. The buffer layer 20 is then formed on the entire surface of the p-type semiconductor layer 18. This is carried out by the plasma CVD method with mono-silane (SiH$_4$), methane gas (CH$_4$) and hydrogen (H$_2$) used as the raw material gas, and the film thickness of the buffer layer 20 is made to be about 13 nm. The intrinsic semiconductor layer 22 is next formed on the entire surface of the buffer layer 20. This is also carried out by the plasma CVD method with mono-silane (SiH$_4$) as the raw material gas. The film thickness of the intrinsic semiconductor layer 22 is made to be about 600 nm.

Figure 8:
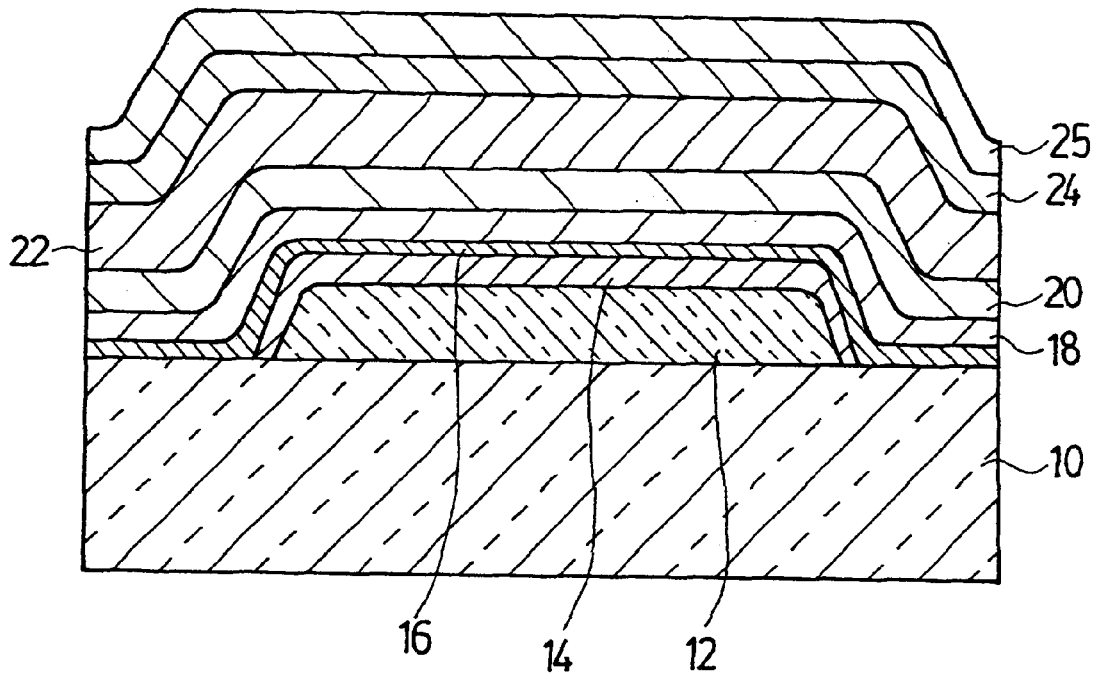

Furthermore, as shown in FIG. 8, the n-type semiconductor layer 24 is formed on the entire surface of the intrinsic semiconductor layer 22. This is performed by the plasma CVD method with mono-silane (SiH$_4$) and phosphine (PH$_3$) as the raw material gas, in such a manner to grow the n-type semiconductor layer 24 up to about 40 nm in film thickness. Then, the metal film 25 for the metal electrode 26 is formed on the entire surface of the n-type semiconductor layer 24 by the sputtering method. The metal film 25 is formed to be about 200 nm in film thickness with titanium (Ti) as the raw material. Thereafter, a photoresist 17 is applied on the entire surface of the metal film 25 to be about 1.2 μm in film thickness by the spin coating method.

Figure 9:
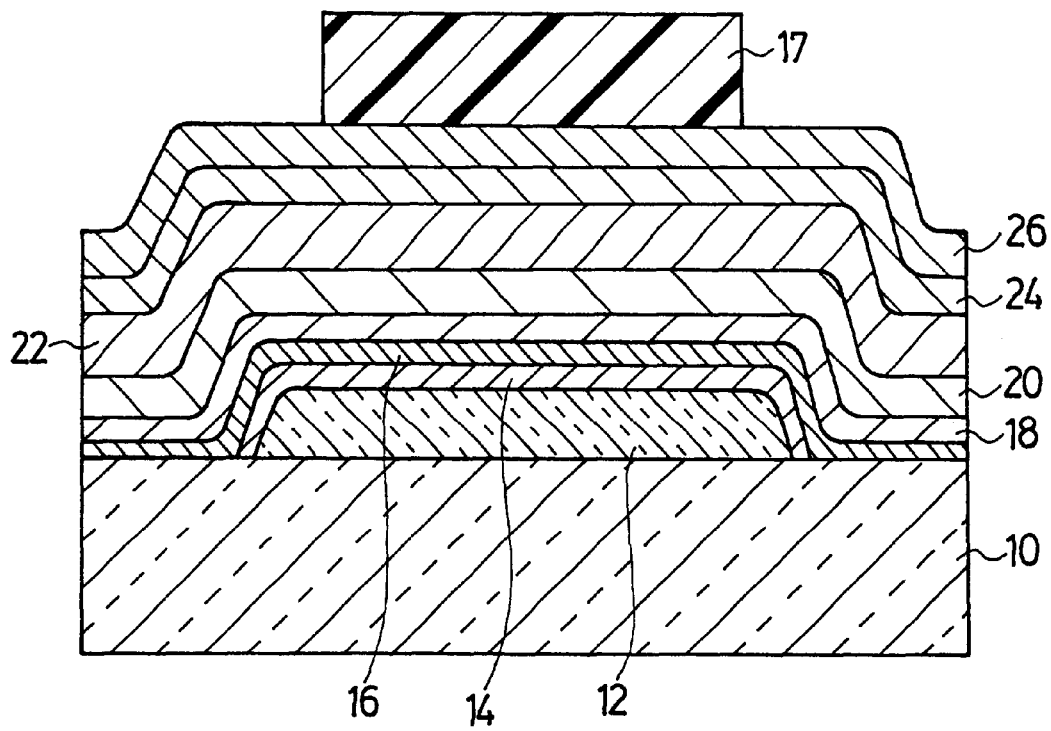

Exposing and developing are performed for the photoresist 17 with a predetermined mask, whereby the photoresist 17 is patterned so as to remain only in a region that will become the solar cell device 2 as shown in FIG. 9. Subsequently, the metal film 25 is first removed through etching by means of the reactive ion etching system using chlorine (Cl$_2$) and boron trichloride (BCl$_3$) as the etching gas with the above photoresist 17 as an etching mask to form the metal electrode 26.

Next, the n-type semiconductor layer 24, the intrinsic semiconductor layer 22, the buffer layer 20, the p-type semiconductor layer 18 and the silicon nitride film 16 laminated under the metal electrode 26 are self alignmently etched by means of the reactive ion etching system, using the above photoresist 17 and the metal electrode 26 as an etching mask and sulfur hexafluoride (SF$_6$), carbon tetrafluoride (CF$_4$) and oxygen (O$_2$) for the raw material gas. Thereafter, the photoresist 17 used for the etching mask is removed.

Consequently, the solar cell device 2 can be fabricated in which the surface treatment layer 14 is formed on the transparent oxide electrode 12, on which the silicon nitride film 16 is formed, and layers from the p-type semiconductor layer 18, the buffer layer 20, the intrinsic semiconductor layer 22, the n-type semiconductor layer 24 to the metal electrode 26 are laminated in that order as shown in FIG. 1.

INDUSTRIAL APPLICABILITY

The solar cell device according to the present invention is provided with the surface treatment layer by oxidative plasma treatment on the surface of the transparent oxide electrode, whereby the surface of the transparent oxide electrode comes to be chemically stabilized. Accordingly, there are no decreases in transmittance thereof and no deterioration in film quality of the amorphous semiconductor layer, and thus the open circuit voltage is improved resulting in preferable output characteristics as a solar cell device. The provision of the silicon nitride film further stabilizes the film quality of the transparent oxide electrode, whereby the open circuit voltage is further improved.

Moreover, through the fabricating method of the solar cell device according to the present invention, a solar cell device in which open circuit voltage is improved and which has preferable output characteristics can be easily fabricated.

What is claimed is:

1. A solar cell device in which a transparent oxide electrode is provided on an insulating substrate, a p-type semiconductor layer, an intrinsic semiconductor layer, and an n-type semiconductor layer are provided over the transparent oxide electrode in that order, and a metal electrode is provided on the n-type semiconductor layer, wherein said transparent oxide electrode is provided by being patterned by dry etching and side faces thereof which are not provided with said p-type semiconductor layer are formed in a tapered shape gradually inclined outward from the top end thereof toward said insulating substrate, wherein said transparent oxide electrode is provided with a surface treatment layer formed by performing oxidative plasma treatment on the entire surface thereof including the side faces which are not provided with said p-type semiconductor layer and said surface treatment layer is between said transparent oxide electrode and said p-type semiconductor layer, wherein a silicon nitride film is provided between the surface treatment layer and said p-type semiconductor layer, and wherein the side faces of said transparent oxide electrode which are not provided with a p-type semiconductor layer are formed to be capable of being connected with an interconnection code via the surface treatment layer.

2. A fabricating method of a solar cell device in which the solar cell device is fabricated by providing a transparent oxide electrode on an insulating substrate, providing a p-type semiconductor layer, an intrinsic semiconductor layer, and an n-type semiconductor layer on the transparent oxide electrode in that order, and providing a metal electrode on the n-type semiconductor layer, said fabricating method comprising the steps of:

forming the transparent oxide electrode by patterning by dry etching so that side faces thereof which are not provided with the p-type semiconductor layer are formed in a tapered shape gradually inclined outward from the top end thereof toward the insulating substrate;

forming a surface treatment layer by performing oxidative plasma treatment using raw material gas composed of oxygen and argon in which the oxygen is included more than the argon on the entire surface of the transparent oxide electrode including the side faces which are not provided with the p-type semiconductor layer;

forming a silicon nitride film on the surface treatment layer;

forming the p-type semiconductor layer, an intrinsic semiconductor layer, and an n-type semiconductor layer on the silicon nitride film in that order; and forming a metal electrode on the n-type semiconductor layer.

3. The fabricating method of the solar cell device according to claim 2, wherein the dry etching in said step of forming the transparent oxide electrode is performed using raw material gas composed of hydrogen iodide and argon.

* * * * *